United States Patent
Ghanevati et al.

(10) Patent No.: US 10,715,088 B1
(45) Date of Patent: Jul. 14, 2020

(54) WIDEBAND LOW NOISE AMPLIFIER WITH NOISE CANCELLATION

(71) Applicant: Northrop Grumman Systems Corporation, Falls Church, VA (US)

(72) Inventors: Manouchehr Ghanevati, Laguna Niguel, CA (US); Timothy R. LaRocca, Torrance, CA (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 16/557,521

(22) Filed: Aug. 30, 2019

Related U.S. Application Data

(63) Continuation-in-part of application No. 16/399,599, filed on Apr. 30, 2019.

(51) Int. Cl.
| | |
|---|---|
| *H03F 1/34* | (2006.01) |
| *H03F 1/26* | (2006.01) |
| *H03F 3/195* | (2006.01) |
| *H03F 1/02* | (2006.01) |
| *H03F 1/56* | (2006.01) |

(52) U.S. Cl.
CPC ............ *H03F 1/26* (2013.01); *H03F 1/0288* (2013.01); *H03F 1/342* (2013.01); *H03F 1/565* (2013.01); *H03F 3/195* (2013.01); *H03F 2200/117* (2013.01); *H03F 2200/129* (2013.01); *H03F 2200/171* (2013.01); *H03F 2200/222* (2013.01); *H03F 2200/294* (2013.01); *H03F 2200/451* (2013.01)

(58) Field of Classification Search
CPC ..... H03F 1/34; H03F 1/68; H03F 1/195; H03F 3/68; H03F 3/195
USPC ................................. 330/292, 295, 109, 294
See application file for complete search history.

(56) References Cited

U.S. PATENT DOCUMENTS

| | | | | |
|---|---|---|---|---|
| 3,944,943 | A * | 3/1976 | Reed ..................... | H03G 3/3036 330/109 |
| 9,735,737 | B2 * | 8/2017 | Gorbachov ........... | H03F 1/0205 |

OTHER PUBLICATIONS

F. Bruccoleri, E. Klumperink, and B. Nauta, "Noise cancelling in wideband CMOS LNAs," in IEEE ISSCC Dig. 2002, pp. 406-407.

(Continued)

*Primary Examiner* — Steven J Mottola
(74) *Attorney, Agent, or Firm* — McCracken & Gillen LLC

(57) ABSTRACT

A low noise amplifier has integral noise cancellation to provide a low noise figure and operation over a frequency range of 0.5 GHz-50 GHz. An amplifier amplifies an input signal as well as noise present with the amplified signal and amplified noise being out of phase and in phase, respectively, with the corresponding inputs. A feedback circuit that is non-linear with frequency enables a constant amplification. A summation circuit combines amplified signals with the noise being cancelled since two combined noise signals being summed are 180 degrees out of phase to each other. An optional secondary amplification stage provides additional amplification. Preferably, the amplifier, auxiliary amplifier and the summation device utilize CMOS transistors disposed on an SOI substrate with impedance stabilization over the frequency range.

15 Claims, 9 Drawing Sheets

(56) References Cited

OTHER PUBLICATIONS

A. Ismail and A. A. Abidi, "A 3-10 GHz LNA with wideband LC-ladder matching network," JSSC, No. 12, Dec. 2004, pp. 2269-2277.
A. Ismail and A. A. Abidi, "A 3-10 GHz LNA with wideband LC-ladder matching network," ISSCC 2004 / SESSION 21 / RF POTPOURRI / 21.4; 2004 IEEE International Solid-State Circuits Conference, 0-7803-8267-6/04, 10 pages.

* cited by examiner

WIDEBAND LOW NOISE AMPLIFIER WITH NOISE CANCELLATION

RELATED APPLICATIONS

This application is a continuation-in-part of U.S. patent application Ser. No. 16/399,599 filed Apr. 30, 2019 entitled Low Noise Amplifier With Noise Cancellation.

BACKGROUND

Embodiments of this invention relate to low noise amplifiers having noise cancellation and are suited for, but not limited to, implementation as semiconductor devices for amplification of signals at millimeter wave frequencies and ultra wideband CMOS applications.

Cancellation techniques have been employed especially in low-frequency electronic devices in order to minimize the presence of an undesired signal. For example, a replica of an undesired signal that is 180° out of phase with the undesired signal can be combined or added to the undesired signal in an effort to minimize the magnitude of the undesired signal. Under a "perfect" condition in which the replica signal is exactly 180° out of phase and has an equal magnitude to the undesired signal, adding these signals together will result in substantially total cancellation.

Cancellation of an unwanted signal using the above explained technique becomes much more difficult at higher microwave frequencies and well into millimeter wave frequencies. It becomes increasingly more difficult to generate the "perfect" replica signal at higher frequencies due to challenges in maintaining the perfect 180° out of phase relationship as well as an equal magnitude to the signal to be canceled. Even more challenges are present when the signal to be canceled is associated with an amplifier, especially where the amplifier operates over a substantial range of high frequencies.

SUMMARY

It is an object of embodiments of the present invention to satisfy the need for a low noise amplifier with noise cancellation, especially but not limited to, an amplifier that operates over an extremely wide range from about 0.5 GHz to well into millimeter wave frequencies while providing a low noise figure.

An exemplary embodiment of a low noise amplifier has integral noise cancellation to provide a low noise figure and operation over a frequency range of 0.5 GHz-50 GHz. A semiconductor amplifier amplifies an input signal as well as noise present with the amplified signal and amplified noise being out of phase and in phase, respectively, with the corresponding inputs. A feedback circuit that is non-linear with frequency enables a constant amplification over the frequency range. An auxiliary semiconductor amplifier amplifies the same inputs and generates an amplified signal and amplified noise both being out of phase relative to the inputs. A summation circuit combines all of these amplified signals with the noise component being cancelled since the auxiliary amplifier provides the same amount of amplification as the amplifier and the amplified noise signals being summed are 180 degrees out of phase to each other. An optional secondary amplification stage provides additional amplification. Preferably, the amplifier, auxiliary amplifier and the summation device utilize CMOS transistors disposed on an SOI substrate with impedance stabilization over the frequency range.

DESCRIPTION OF THE DRAWINGS

Features of exemplary implementations of the invention will become apparent from the description, the claims, and the accompanying drawings in which:

DETAILED DESCRIPTION

One aspect of embodiments of the present invention resides in the recognition that by providing noise cancellation for noise associated with a first amplification stage of a LNA by utilizing a secondary amplification stage and signal summation to achieve noise cancellation, the noise at the output of the LNA circuitry will be primarily determined by only the noise associated with secondary amplification and summation stages. The secondary and summation stages can be selected and configured to achieve very low noise figure even at millimeter wave frequencies of operation.

Another aspect of embodiments of the present invention with an operating range of 0.5 GHz-50 GHz resides in the recognition that intrinsic parasitic capacitances, e.g. input capacitance $C_{gs}$, $C_{ds}$ and $C_{gd}$, associated with the active device responsible for noise cancellation should be taken into account so that the gain associated with the noise feedback signal remains substantially constant over the wide range of frequencies. This is accomplished by utilizing a frequency dependent circuit in the noise cancellation feedback path that compensates for the influence of the parasitic capacitances to maintain a substantially flat/constant gain for the noise cancellation feedback signal over the wide range of frequencies.

Figure 1:
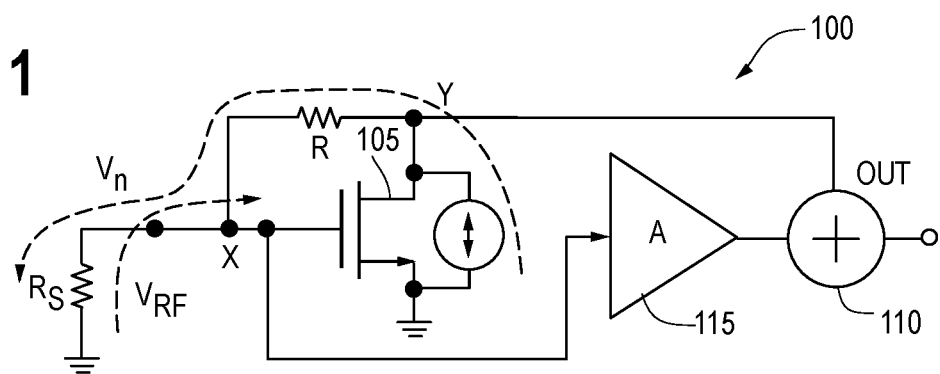
FIG. 1 is a simplified schematic diagram showing the concepts of a low noise amplifier with noise cancellation in accordance with embodiments of the present invention.

FIG. 1 shows a simplified schematic diagram showing the concepts of a low noise amplifier with noise cancellation in accordance with embodiment 100 of the present invention. A common source transistor 105 provides an amplification stage with its output Y coupled to one input of the summation stage 110. The input X to transistor 105 also provides an input to inverting amplifier 115 whose output is connected to the other input of the summation stage 110. The resistor $R_s$ represents the resistance of the input signal source and resistor R is the feedback resistance resulting in the amplification provided by the amplification stage of: $Y=X*(1-g_m*R)$. The noise amplification factor from node X to node Y is $1+R/Rs$.

The input signal voltage $V_{rf}$ at X is amplified to provide a voltage at Y that is amplified and 180° out of phase with Vif voltage, if $g_m*R$ is >1. The voltage Vn represents the noise voltage which has the same phase at the input and output of transistor 105. The 180° phase inversion provided by amplifier 115 results in the signal $V_{rf}$ as inverted by amplifier 115 having the same phase as the signal $V_{rf}$ at Y, and hence the signals are in phase and additive in magnitude at the output of the summation 110. However, the 180° phase inversion provided by amplifier 115 results in the noise Vn from X being amplified and 180° out of phase with the noise at Y at the output of the amplifier 115. Hence the noise signals as combined at the summation circuit 110 are subtractive, i.e. out of phase with opposite magnitudes, at the output of the summation circuit 110. To maximize noise cancellation, the amplification provided by amplifier 115 should be $-(1+R/R_s)$ so that the magnitude of noise provided at the output of amplifier 115 is the same magnitude as the noise at Y but with the opposite phase. With the noise of the input amplifier stage 105 being canceled, the noise of the overall circuit is then substantially determined only by the noise of the secondary stage, amplifier 115, and the summation circuit 110. The summation circuit 110 could be a "Y" connection of three resistors or use active devices, e.g. transistors, to combine the two signal paths.

Figure 2:
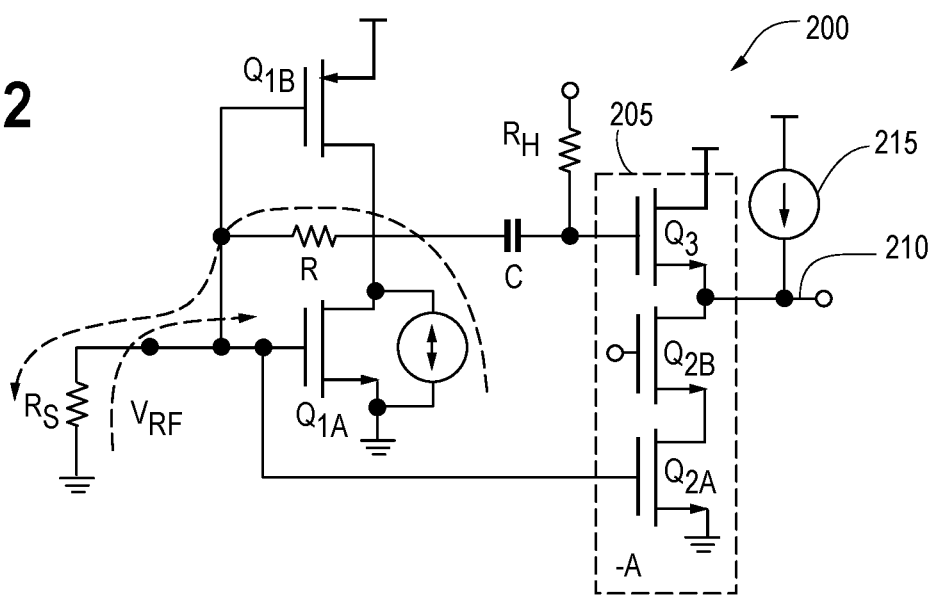
FIG. 2 is a schematic diagram of an embodiment of a low noise amplifier with noise cancellation in accordance with an embodiment of the present invention.

FIG. 2 shows a more detailed schematic diagram of an embodiment 200 of a low noise amplifier with noise cancellation in accordance with the present invention. The same basic principles for noise cancellation are utilized in embodiment 200 as explained for the embodiment 100. A matching amplifier Q1B is implemented as a resistive feedback inverter that operates in conjunction with amplifier Q1A to form the amplification stage. The overall transconductance gain for the amplifier stage is $g_m=g_{m,nmos}+g_{m,pmos}$, i.e. the sum of the gains for Q1A and Q1B. It should be noted that as the physically implemented device sizes increase, the drain to source resistance, $R_{ds}$, decreases which causes the noise signal to leak back into the channel and not be cancelled. Furthermore, both active input amplification devices exhibit input parasitic capacitance resulting in noise signal leakages that are frequency dependent.

The combined secondary stage and adder 205 is implemented as source follower Q3 on top of a cascode common source amplifier Q2A and Q2B. The noise voltage gain A$(=-(1+R/Rs))$ is equal to the $-g_{m2A}/g_{m3}$. Therefore, the Q2A device should be physically sized A times larger than Q3 to achieve the correct gain so that the magnitude of the noise signal coming from the drain of Q2B is the same as the magnitude of the noise signal coming from the source of Q3. This implies that the gain of the output from drain of the amplifier Q1A is "A". Sizing must be considered since if the size of Q2A is too much larger than the input capacitance at the gates of Q1A and Q1B, Cgs2 (gate to source capacitance of Q2A) will affect the input matching. A separate current source 215 can be used to help steer the current from the common-source cascode devices, Q2A and Q2B, since they are much larger than the source follower Q3. A high pass filter, capacitor C and resistor $R_h$, filters the amplified signal as coupled to the input gate of Q3. Bias voltages are not shown but will be apparent to those skilled in the art in view of the later discussed embodiments.

Figure 3:
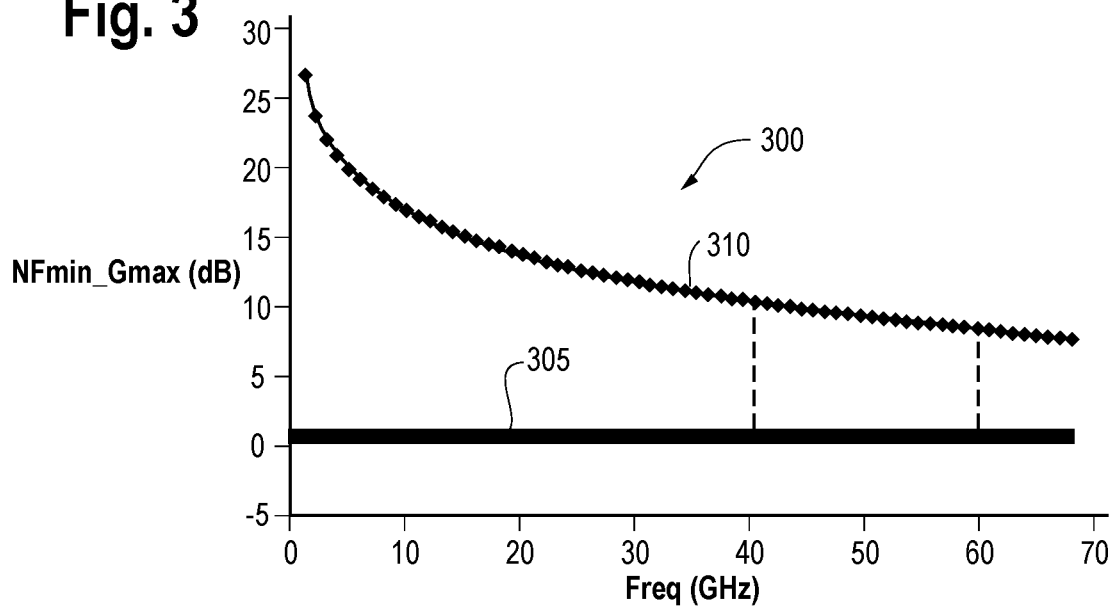
FIG. 3 is a graph illustrating a noise figure and gain anticipated for a 72 μm CMOS semiconductor device using 45 nm 12 SIO (silicon on insulator).

FIG. 3 shows a graph illustrating a noise FIG. 305 and gain 310, both in decibels, anticipated for a 72 μm CMOS semiconductor device using 45 nm 12 SIO (silicon on insulator) technology with operation at 0.8 v and 10 mA for the frequencies as shown. It will be noted that the noise figure is less than 3 db at 60 GHz, about 2 db at 40 GHz, and is lower than that at lower frequencies. A maximum gain at 40 GHz is about 11 db and falls substantially linearly to just under 10 db at 60 GHz. This demonstrates the suitability for use in embodiments of the present invention.

Figure 4:
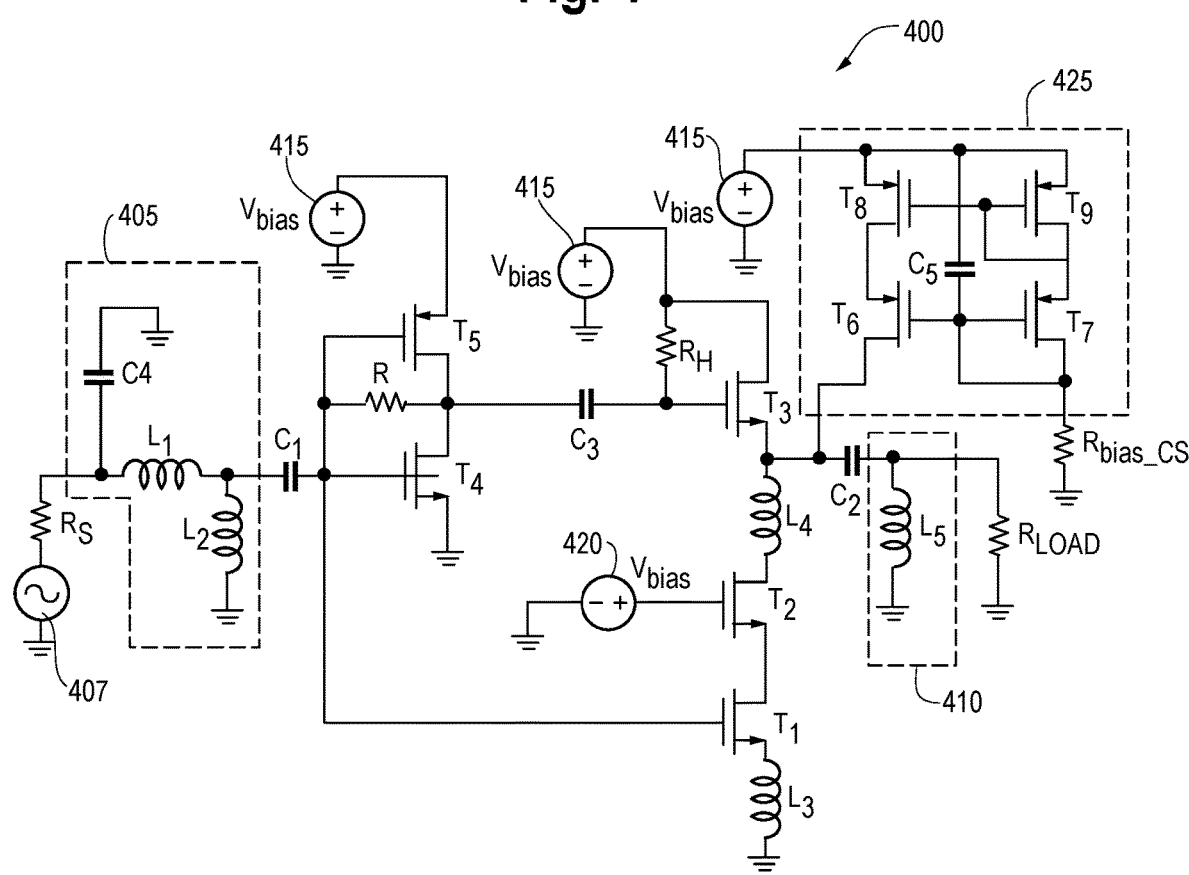
FIG. 4 is a more detailed schematic diagram of a low noise amplifier with noise cancellation in accordance with an embodiment of the present invention suitable for operation at millimeter wave frequencies.

FIG. 4 shows a more detailed schematic diagram of an embodiment 400 of a low noise amplifier with noise cancellation suitable for operation over a range of millimeter wave frequencies, i.e. from 40 GHz to 60 GHz. Embodiment 400 is substantially similar to embodiment 200 and operates using the same principles. Thus, only differences between these embodiments will be primarily discussed. The 5 active devices in embodiment 200 correspond to the respective 5 devices, T1-T5, in similar circuit locations in embodiment 400 where each respective transistor performs a corresponding function.

A matching network 405 together with capacitor C1 form an input matching network to provide impedance matching between the signal source 407 and the gates of the primary amplification stage provided by transistors T4 and T5. Similarly, matching network 410 together with capacitor C2 form an output matching network to provide impedance matching between the amplified output, i.e. the source of transistor T3, and the next stage to receive the amplified signal as represented by resistor Rload. In the exemplary embodiment 400, the amplifier is suited for millimeter wave operation from 40 GHz to 60 GHz. DC supply voltage sources 415 are provided as shown to power the active devices. As will be understood, the DC bias voltage source 420 associated with the gate of transistor T2 will be set to an appropriate DC voltage to bias the transistor T2 to an active linear region of operation.

Embodiment 400 provides an implementation of a current source 425 and input and output matching networks, 405 and 410, that enhances broadband operation at the millimeter wavelength (MMW) frequencies. A successful noise cancelling (NC)LNA for MMW applications with a 20 GHz range of operation is challenging. Gain selection of the auxiliary amplifier T1/T3 is preferably based on the voltage amplification ratio of the noise signal in the input stage T4/T5. Effective cancellation of noise from the input stage will not occur at the output if significant interstage impedance mismatches or noise current leakage are present. However, implementation of matching networks at Gigahertz frequencies provide complications such as adding parasitics.

For example, inductors, in general as well as inductors implemented in CMOS technology, exhibit self-resonance-frequency (SRF) based on the values of inductance and parasitic capacitance of the inductor itself. There is also resistive loss associated with inductors. These factors may adversely impact the bandwidth (BW) of operation. In view of these considerations, the gain of the input amplifier stage should preferably be higher, e.g. 5 times higher, than the unloaded gain of the auxiliary amplifier. This can be achieved by selecting a high $R/R_s$ ratio that is substantially larger, e.g. more than 5 times larger, than the gain of the auxiliary amplifier (i.e., $|1+R/R_s|>g_{m2}/g_{m3}$). As transistors T1 and T2 have identical size, gains $(g_{m1}/g_{m3})=(g_{m2}/g_{m3})$. A higher input stage gain also reduces noise contribution of the feedback resistor R since the noise is scaled down by input stage gain.

As noise contribution of the input stage and feedback resistor is now minimized, the noise associated with the output stage (auxiliary amplifier plus adder) will dominate the overall LNA noise. Increasing $g_{m1}$ and $g_{m2}$ can result in higher output stage gain and thereby reduction in noise. One way to achieve this is by steering current from an external current source. Since transistors T1 and T2 have higher gm values than transistor T3, transistors T1 and T2 can carry more DC current without interfering with current through transistor T3. Therefore, an external current source can be used to supply current to only transistors T1 and T2. A simple current source that does not provide sufficient isolation from the auxiliary amplifier will result in degrading the noise performance and frequency response at MMW frequencies. To overcome this, a cascode current source 425, with transistors T6-T9 and bypass capacitor C5, is used to reduce any undesired loading effects on the auxiliary amplifier.

Additional enhancements assist in more effective operation at MMW frequencies over an extended bandwidth. Specifically, inductive degeneration is incorporated in the output stage to enhance noise reduction. For example, the use of an inductor L3 in series with the source of T1 and an inductor L1 in series with amplification stage internal input capacitance, Cgs, results in a desired real input impedance over much of the frequency bandwidth. The use of inductive degeneration by L3 results in improved performance over a wide frequency range. Proper selection of L3 is a balance between input impedance and broadband matching on one hand and noise factor (NF) performance. A parasitic reduction technique can be applied to the auxiliary amplifier by inserting an inductor L4 between source of T3 and drain of common gate transistor T2. This has the effect of counteracting/reducing the overall series capacitance Cgs for T3 and Cds for T2. The inductor L4, with a value selected based on device size and the parasitic capacitance of L4, helps to effectuate matching between T2 and T3 resulting in optimum current flow and increased gain in the system. In effect, the inductor L4 transforms the highly capacitive output impedance (looking into drain of T2) to a lower impedance value where current flows more effectively between the two transistors. This correction is preferably optimized so that frequency stability is not compromised as a result of higher gain and that output return loss is also not compromised. For example, for 45 nm 12 SOI technology, depending on device sizes T1/T2, L4 can range between 80-150 pH for low power applications. A gate resistor $R_h$ of few kilo ohms is used to further reduce the noise figure as a result of auxiliary stage loading effects. The combination of the series capacitance between the drains of T4/T5 and $C_{gs}$ of T3 together with the gate resistance $R_h$ forms a high-pass filter. The high pass filter sets the low frequency of the desired frequency range of operation. For MMW applications, a low loss capacitor value a fraction of one pico Farad can be used.

The inductors are important in impedance matching especially at MMW frequencies and are preferably characterized for their inductance value, Q factor, and SRF. All inductors should preferably exhibit SRF beyond 100 GHz for operation of the amplifier over the 40 GHz-60 GHz range. Furthermore, it is expected that the inductors in SOI technology will suffer less ohmic loss compared with inductors implemented in Bulk Silicon.

To further enhance the frequency of operation and BW, a broadband input matching network 405 should be used. The input and output DC blocking capacitors C1, C2 are preferably incorporated as part of the input and output matching circuits. This is preferred as these capacitors will typically be small, e.g. <1pF, at MMW frequencies and pose smaller parasitic and loss. The combination of shunt inductor (L2=106pH), series inductor (L1=100pH), and shunt capacitor (C4=26.5×10$^{-15}$ Farad) provide a wideband impedance transformation to the source impedance.

Figure 5:
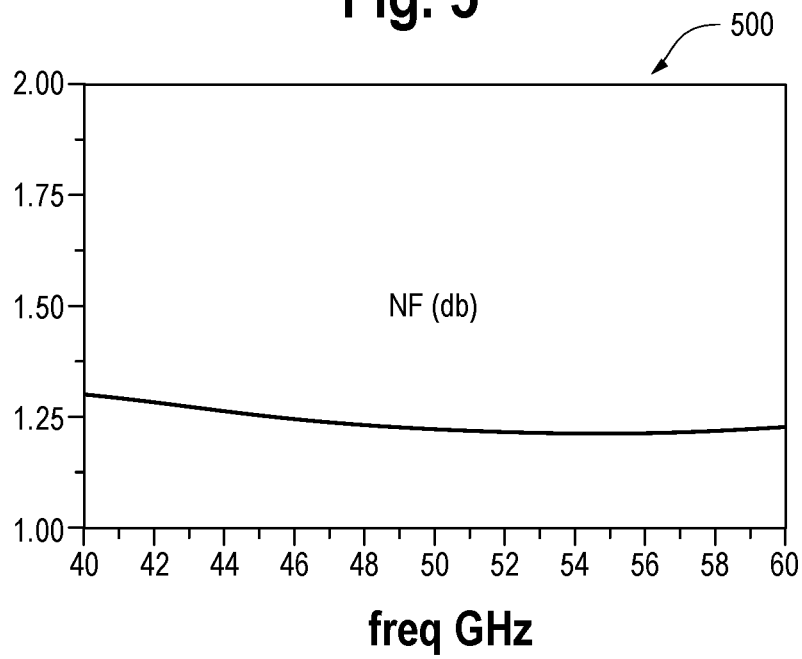
FIGS. 5 and 6 are graphs of noise figure for the embodiment shown in FIG. 5 before and after device extraction, respectively.
Figure 6:
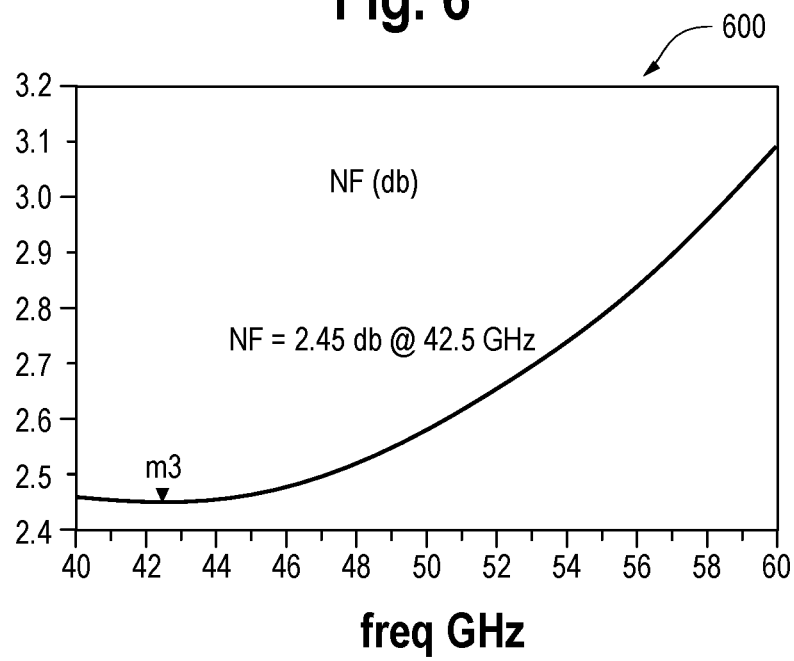

FIGS. 5 and 6 are graphs 500 and 600 of noise figures for the embodiment shown in FIG. 5 before and after device extraction, respectively. Device extraction, following an integrated circuit layout of the device, determines the resistance, capacitance, and inductance at various nodes of the device. It better predicts the actual realizable behavior of the device. As shown in FIG. 6, an extraction was performed and device capacitance and resistance at all significant nodes were calculated. As shown, a 3 dB NF, or less, over 20 GHz from 40 GHz to 60 GHz is achieved.

Figure 7:
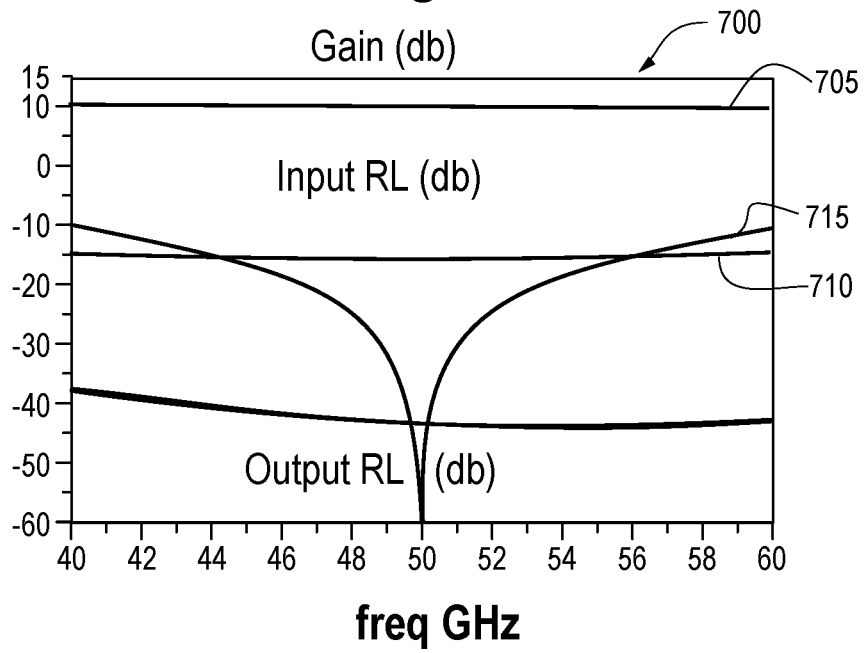
FIG. 7 is a graph showing gain and input/output return loss over the millimeter frequency range of 40-60 GHz for the embodiment shown in FIG. 5.

FIG. 7 is a graph 700 showing gain 705, input return loss 710 and output return loss 715 over the millimeter frequency range of 40-60 GHz for the embodiment shown in FIG. 5.

Figure 8:
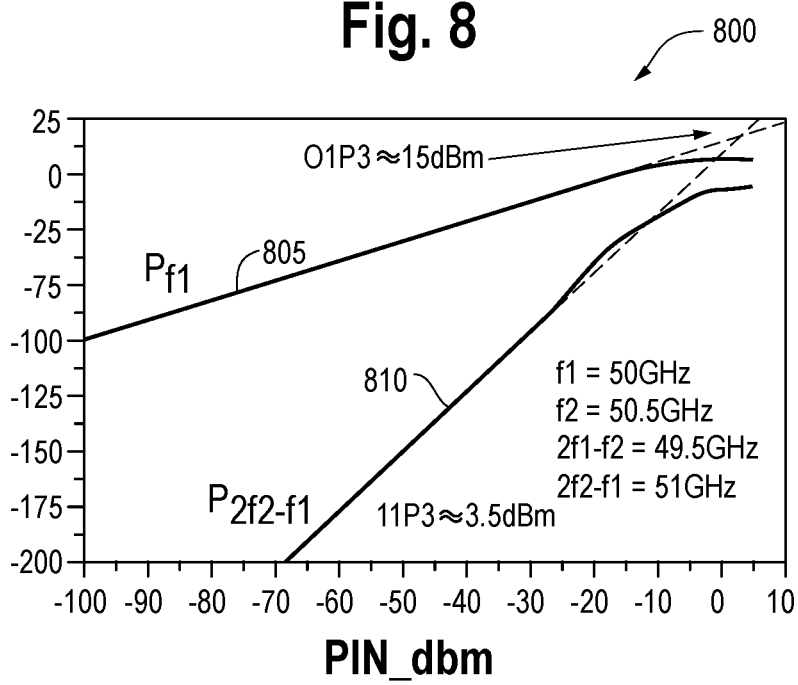
FIG. 8 is a graph showing third order distortion associated with the embodiment shown in FIG. 5.

FIG. 8 is a graph 800 that displays the results of a simulated two-tone test for third order distortion associated with the embodiment shown in FIG. 5. Graph 800 is a plot of a typical two-tone test. Two frequency signals f1 and f2 (with 0.5 GHz frequency spacing) are injected at the input of amplifier. The power of signals f1 and f2 are increased and powers for f1 signal, f2 signal, and distortion products at 2f1-f2 and 2f2-f1 are measured at the output of amplifier. Output Third-order Intermodulation Product (OIP3) is achieved from intersection of extrapolated power line slopes 805 and 810. The line slopes for 805 and 810 are 1 and 3, respectively. The predicted value of 15 dBm for O1P3 is very good for low power applications at MMW frequencies.

Additional linearization techniques can be applied to the NCLNA circuit without adversely effecting NF and input matching, for example, Derivative Superposition (DS). DS takes advantage of the complementary nature of T4/T5 in the input amplification stage. By biasing the gates of PMOS(T5) and NMOS(T4) differently, and/or by adjusting individual physical size of T4 vs. T5, nonlinear transconductance coefficients (third derivative of Id versus Vgs) that are out of phase are generated and cancel after addition since both devices T4/T5 share a common drain current. This results in further Input Third-order Intermodulation Products (IIP3) improvement as a result of reduction in third-order nonlinearity coefficient within drain current. An IIP3 of well beyond 5 dBm is achievable using the above linearization techniques. Although transistors T4, T5 and T1 share a common gate voltage as shown in FIG. 4, providing an AC only coupling of T1 transistor to T4/T5 (e.g. using a series capacitor) can enhance DS linearization. This would of course require the addition of a bias resistor/circuit to provide T1 gate with an independent gate bias voltage.

9A shows a schematic diagram of a low noise amplifier 900 with noise cancellation suited for low noise operation over frequencies 0.5 GHz-40 GHz. This exemplary embodiment utilizes 12 SOI 45 nm CMOS technology selected for its low noise figure and gain available at this range of frequencies, and relative low cost. Since low noise amplifier 900 has substantial similarities to the amplifier 400, the explanation of this circuitry will concentrate on the differences between amplifier 900 and amplifier 400. As explained in more detail with regard to FIG. 2, the resistor R of amplifier 400 is the feedback element that controls the amplification of the noise signal, and provides a constant gain factor.

The presence of Cinput or $C_{in}$, which is the intrinsic input capacitance of the active device, adds complexity to noise cancellation mechanism as the input impedance is frequency dependent. The following explanation is intended to explain why the inductor L2 is helpful. Refer to the circuit of FIG. 2 where only a single feedback resistor R is used. Since the input impedance varies with frequency, the noise amplification would vary with frequency. It can be shown that the input impedance of the feedback device is approximately equal to:

$Z_{in}=1/(g_m+SC_{in})$ where $g_m$ is device transconductance and $S=j\omega=j2\pi f$ is in general the complex frequency.

As the input impedance becomes reactive, more noise current flows to the input capacitance undermining noise cancellation with increases in frequency. The noise voltage gain, i.e. the ratio of noise voltage at nodes at the drain and gate of $Q_{1A}$, therefore becomes frequency dependent and grows as frequency increases, as shown below.

$AV_{in}(s)=1+R/R_s*(1+SC_{in}R_s)$.

The input voltage gain (the ratio of voltage at the gate of $Q_{1A}$ to input voltage) decreases with increases in frequency, as implied by the expression:

$AV_{in}(s)=(1-g_m R)/(1+g_m R_s+SC_{in}R_s)$.

The analysis above shows that noise cancellation degrades with increases in frequency due to device parasitic capacitance. Therefore, noise cancellation must overcome device parasitic for ultra-wideband operation.

Figure 9A:
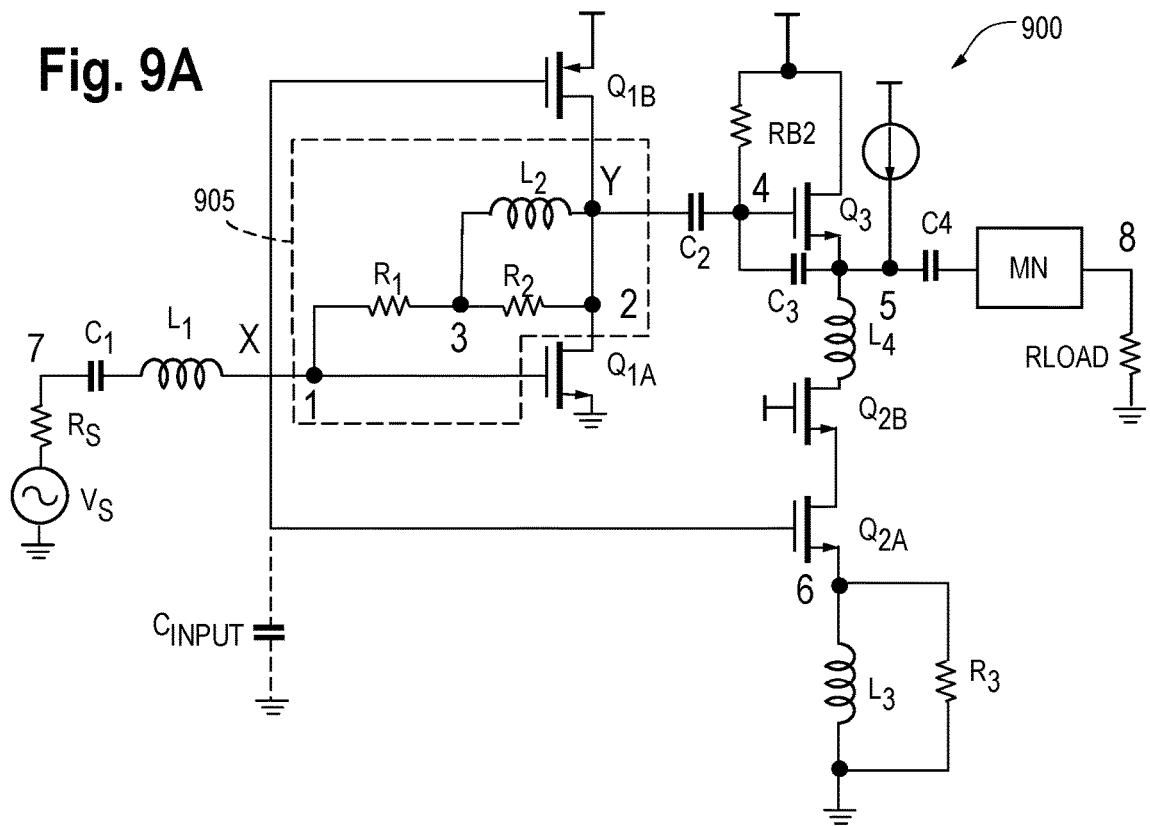
FIG. 9A is a schematic diagram of a low noise amplifier with noise cancellation suited for operation over a wide range of frequencies.

Referring to FIG. 9A, the feedback circuit 905 provides a gain that varies with frequency to compensate for the influence of the parasitic capacitances associated with this active amplifier so that a substantially constant feedback gain is applied to the noise signal over the frequency range in order to maintain maximum cancellation of the in phase and out of phase noise signals. The exemplary feedback circuit 905 includes resistor R1, resistor R2, and inductor L2. At lower frequencies in the range of frequencies the inductor L2 provides a very low impedance across resistor R2 resulting in resistor R1 primarily determining the gain factor. As frequency increases within the range of frequencies, the impedance of inductor L2 increases so that the gain factor is determined by resistor R1 in series with the impedance represented by the parallel combination of resistor R2 and inductor L2. This has the impact of producing a positive gain slope with increasing frequency. The values of resistors R1 and R2 and inductor L2 are selected to provide a positive gain slope that offsets the roll-off/decrease of gain due to the parasitic capacitances associated with Q1A so that the net effect is to provide a constant/flat gain profile over the extremely wide frequency range of operation. The inductor L2 should have a self-resonance frequency beyond the highest frequency of operation. Other feedback circuitry that provides changing the slope of the gain versus frequency could be utilized, e.g. circuits with capacitors or a combination of inductors and capacitors.

Figure 9B:
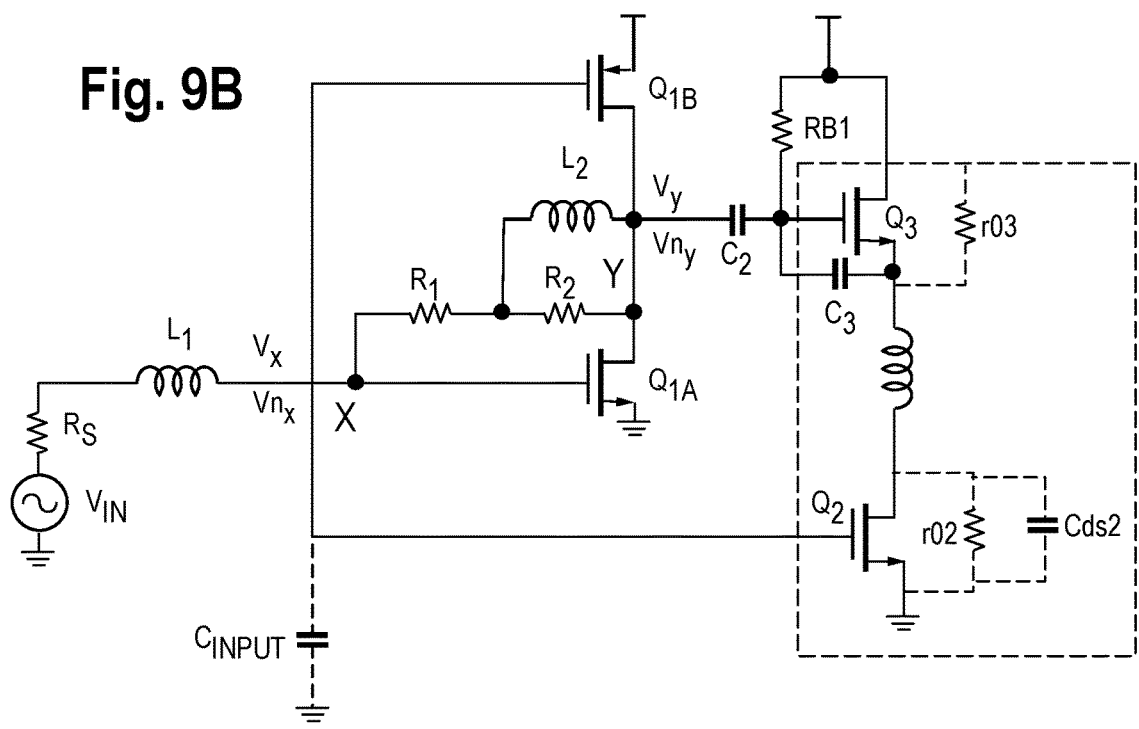
FIG. 9B is a simplified schematic diagram of the low noise amplifier to aid in understanding the explanation that includes equations.

FIG. 9B provides a simplified version of FIG. 9A in which more detailed mathematical expressions and explanations of the ultra-wideband operation is presented. For noise analysis, C1 has been removed from the circuit and noise contribution of Q1b has been ignored. The presence of L1 partially cancels the device input capacitance resulting in better input matching condition and operation over wider frequency, as shown in expressions below:

$$Z_{in}(s) = SL_1 + \frac{1}{g_{m1} + SC_{in}}$$

$$Z_{in}(j\omega) = j\omega L_1 + \frac{1}{g_{m1} + j\omega C_{in}}$$

The presence of L1, L2, and R2, results in new expressions for the signal gain and noise gain between nodes x and y. Examination of these equations reveals reduction and cancellation of noise leakage and reshaping and extending of the signal gain by effectively inserting a zero in the gain transfer function. This additional zero provides an upward tilt in the gain while device input parasitic capacitance and Miller effect capacitance tend to reduce the bandwidth of operation. Expressions for noise gain and signal gains are given below:

$$\frac{V_y}{V_x}(j\omega) = 1 - g_{m1}\left(R_1 + \frac{R_2 j\omega L_2}{R_2 + j\omega L_2}\right)$$

$$\frac{V_x}{V_{in}}(j\omega) = \frac{1}{1 + g_{m1}(R_s + j\omega L_1) + j\omega C_{in}(R_s + j\omega L_1)}$$

$$\frac{V_y}{V_{in}}(j\omega) = \frac{V_y}{V_x} \cdot \frac{V_x}{V_{in}} = \frac{1 - g_{m1} Z_F(j\omega)}{1 + g_{m1}(R_s + j\omega L_1) + j\omega C_{in}(R_s + j\omega L_1)}$$

where $$Z_F(j\omega) = R_1 + \frac{R_2 j\omega L_2}{R_2 + j\omega L_2}$$

and $$Av_n(j\omega) = \frac{V_{ny}}{V_{nx}}(j\omega) = 1 + \frac{Z_F(j\omega)}{(R_s + j\omega L_1)}[1 + j\omega C_{in}(R_s + j\omega L_1)]$$

where,
$Z_F(j\omega)$ is Q1a feedback impedance containing R1, R2, and L2.
The expressions for noise voltages at nodes x and y in terms of Q1 noise current are now given by $$V_{nx} = i_{n1} \frac{R_s + SL_1}{S^2 L_1 C_{in} + S(C_{in}R_s + g_{m1}L_1) + g_{m1}R_s + 1}$$

$$V_{ny}(s) = i_{n1} \frac{[\beta(s) - g_{m1}(R_s + SL_1)](Z_F(s)\alpha(s) + R_s + SL_1)}{\alpha(s)\beta(s)}$$

where
$i_{n1}$=4 k T$\gamma g_{m1}$
k=1.38×10$^{-23}$ J/K is Boltzman constant

T=temperature in Kelvin
γ=device excess noise coefficient
$g_{m1}$=transconductance for Q1a
and $$\alpha(s) = S^2 L_1 C_{in} + SC_{in} R_s + 1$$

$$\beta(s) = S^2 L_1 C_{in} + S(C_{in} R_s + g_{m1} L_1) + g_{m1} R_s + 1$$

Note that at DC $V_{ny}$ reduces to the expected expression below $$V_{ny}(s = j\omega = 0) = i_{n1} \frac{R_1 + R_S}{1 + g_{m1} R_s}$$

For noise cancellation, the gain of the auxiliary amplifer is now frequency dependent and is given by $$A(s) = -Av_n(s) = -\frac{V_{ny}}{V_{nx}} = -\left\{1 + \frac{Z_F}{(R_s + SL_1)}[1 + SC_{in}(R_s + SL_1)]\right\}$$

Note that the above gain at DC reduces to the expected expression below:

$$A(s = j\omega = 0) = -\left(1 + \frac{R_1}{R_s}\right)$$

To determine the total signal gain from input to output, we first determine the output signal, Vout using superposition principle:

$$V_{out} = V_{out1} + V_{out2} = V_x\left(-\frac{g_{m2}}{g_{m3}}\right) + V_y \frac{g_{m3}(SL + Z_{O2})}{1 + g_{m3}(SL + Z_{O2})}$$

where $$Z_{O2}(s) = r_{O2} \| C_{ds2} = \frac{r_{O2}}{1 + SC_{ds2}}$$

$Z_{O2}(s)$=output impedance for Q2 containing intrinsic components $r_{O2}$ and $C_{ds2}$
$V_{out}=V_{out1}+V_{out2}$=sum of voltages at the output due to auxiliary path and the main path
$V_{out}=V_{out1}$ when $V_x$ is present and $V_y=0$
$V_{out}=V_{out2}$ when $V_y$ is present and $V_x=0$
The total signal gain can be written as $$Av_{sig}(s) = \frac{V_{out}}{V_{in}}(s) = \gamma_2\left(-\frac{g_{m2}}{g_{m3}}\right) + \gamma_1 \gamma_2 \frac{g_{m3}(SL + Z_{O2})}{1 + g_{m3}(SL + Z_{O2})}$$

$$Av_{sig}(j\omega) = \frac{V_{out}}{V_{in}}(j\omega)$$
$$= \gamma_2(j\omega)\left(-\frac{g_{m2}}{g_{m3}}\right) + \gamma_1(j\omega)\gamma_2(j\omega) \frac{g_{m3}(j\omega L + Z_{O2})}{1 + g_{m3}(j\omega L + Z_{O2})}$$

where $$\gamma_1(j\omega) = 1 - g_{m1} Z_F(j\omega) = 1 - g_{m1}\left(R_1 + \frac{R_2 j\omega L_2}{R_2 + j\omega L_2}\right)$$

$$\gamma_2(j\omega) = [1 + g_{m1}(R_s + j\omega L_1) + j\omega C_{in}(R_s + j\omega L_1)]^2$$

Note that if $g_{m1}=1/R_s$, the signal gain reduces to $-R_1/R_s$, as expected.

The simplified noise figure expression of the circuit in FIG. 9B can be written as $$NF = 1 + \frac{\overline{V_{nR1}^2}(j\omega)}{4kTR_s |Av_{sig}(j\omega)|^2} + \frac{\overline{V_{nR2}^2}(j\omega)}{4kTR_s |Av_{sig}(j\omega)|^2} + \frac{\overline{V_{ny}^2}(j\omega)}{4kTR_s |Av_{sig}(j\omega)|^2} + \frac{\overline{V_{nx}^2}(j\omega)}{4kTR_s |Av_{sig}(j\omega)|^2} + \frac{4KT\gamma g_{m3}|\alpha 2(j\omega)|^2}{4kTR_s |Av_{sig}(j\omega)|^2} + \frac{4KT\gamma g_{m2}|\beta 2(j\omega)|^2}{4kTR_s |Av_{sig}(j\omega)|^2}$$

where, $$\overline{V_{nR1}^2}(j\omega) = i_{nR1}^2 |R_1 + j\omega L_1 + R_s|^2 = \frac{4kT}{R_1}[(R_1 + R_s)^2 - (\omega L_1)^2]$$

$\overline{V_{nR1}^2}(j\omega)$ = Noise voltage for resistor R1

$$\overline{V_{nR2}^2}(j\omega) = i_{nR2}^2 \left|\frac{R_2 j\omega L_2}{R_2 + j\omega L_2} + R_1 + j\omega L_1 + R_s\right|^2 = \frac{4kT}{R_2}\left|\frac{R_2 j\omega L_2}{R_2 + j\omega L_2} + R_1 + j\omega L_1 + R_s\right|^2$$

$\overline{V_{nR2}^2}(j\omega)$ = Noise voltage for resistor R2

$$\overline{V_{nAdder}^2}(j\omega) =$$

$$i_{n3}^2 \left|\frac{\left(\frac{1}{g_{m3}}\right)\left(j\omega L + \frac{1}{j\omega C_{ds2}}\right)}{\left(\frac{1}{g_{m3}}\right) + \left(j\omega L + \frac{1}{j\omega C_{ds2}}\right)}\right|^2 + i_{n2}^2 \left|\frac{\left(\frac{1}{j\omega C_{ds2}}\right)\left(j\omega L + \frac{1}{g_{m3}}\right)}{\left(\frac{1}{j\omega C_{ds2}}\right) + \left(j\omega L + \frac{1}{g_{m3}}\right)}\right|^2 =$$

$$4kT\gamma g_{m3} \left|\frac{\left(\frac{1}{g_{m3}}\right)\left(j\omega L + \frac{1}{j\omega C_{ds2}}\right)}{\left(\frac{1}{g_{m3}}\right) + \left(j\omega L + \frac{1}{j\omega C_{ds2}}\right)}\right|^2 +$$

$$4kT\gamma g_{m2} \left|\frac{\left(\frac{1}{j\omega C_{ds2}}\right)\left(j\omega L + \frac{1}{g_{m3}}\right)}{\left(\frac{1}{j\omega C_{ds2}}\right) + \left(j\omega L + \frac{1}{g_{m3}}\right)}\right|^2$$

$\overline{V_{nAdder}^2}(j\omega)$ = Noise voltage for auxiliary amplifier and adder circuit Noise of the auxiliary amplifier / adder circuit can be further simplified as $$\overline{V_{nAdder}}^2(j\omega) = 4kT\gamma g_{m3}|\alpha 2(j\omega)|^2 + 4kT\gamma g_{m2}|\beta 2(j\omega)|^2$$

where, $$\alpha 2(j\omega) = \frac{(1 - \omega^2 LC_{ds2})^2}{[g_{m3}(1 - \omega^2 LC_{ds2})]^2 + (\omega C_{ds2})^2}$$

$$\beta 2(j\omega) = \frac{1 - (\omega L g_{m3})^2}{[g_{m3}(1 - \omega^2 LC_{ds2})]^2 + (\omega C_{ds2})^2}$$

$C_{ds2}$=intrinsic device capacitance between drain and source of Q2
r02, r03 are intrinsic output resistance for Q2 and Q3.
$g_{m2}$ and $g_{m3}$ are transconductance for Q2 and Q3 transistors.
Examination of expressions for α2(jω) and β2(jω) show that noise of the Auxiliary amplifier / Adder circuit can be minimized by proper selection of inductance L and $g_{m3}$.

Furthermore, since signal gain $Av_{sig}$ is proportional to the ratio $g_{m2}/g_{m3}$, NF can be decreased by increasing this ratio, as NF is normalized by the total signal gain.

Other factors associated with amplifier 900 also contribute to the exceptionally wide bandwidth with a low noise figure. It will be noted that the combination of capacitor C2 and resistor RB1 constitute an inter-stage high-pass filter. Thus, the values of these components should be selected so that the desired highest frequency of operation is not limited by setting the high-pass filter at too low a frequency. The inductor L3 in series with the source of Q2A aids in neutralizing the parasitic effect due to $C_{gs}$ of Q2A. The resistor R3 in parallel with inductor L3 assists in optimizing the input impedance of Q2A without adversely affecting device bias conditions.

The inductor L4 assists in reduction of the parasitic capacitance ($C_{gs}$ for Q3 and $C_{ds}$ for Q2B) and provides matching between Q3 and Q2B. This inductor transforms the capacitive output impedance looking into the drain of Q2B to a lower impedance value permitting the more effective flow of current between the 2 transistors.

Since the ratio of $g_{m2}/g_{m3}$ (gains of transistors 2 and 3) determines the gain of the auxiliary amplification provided by Q2/Q3, a larger Q2 device size contributes to higher gain and also to lowering the device noise factor due to the increased gain.

Figure 10:
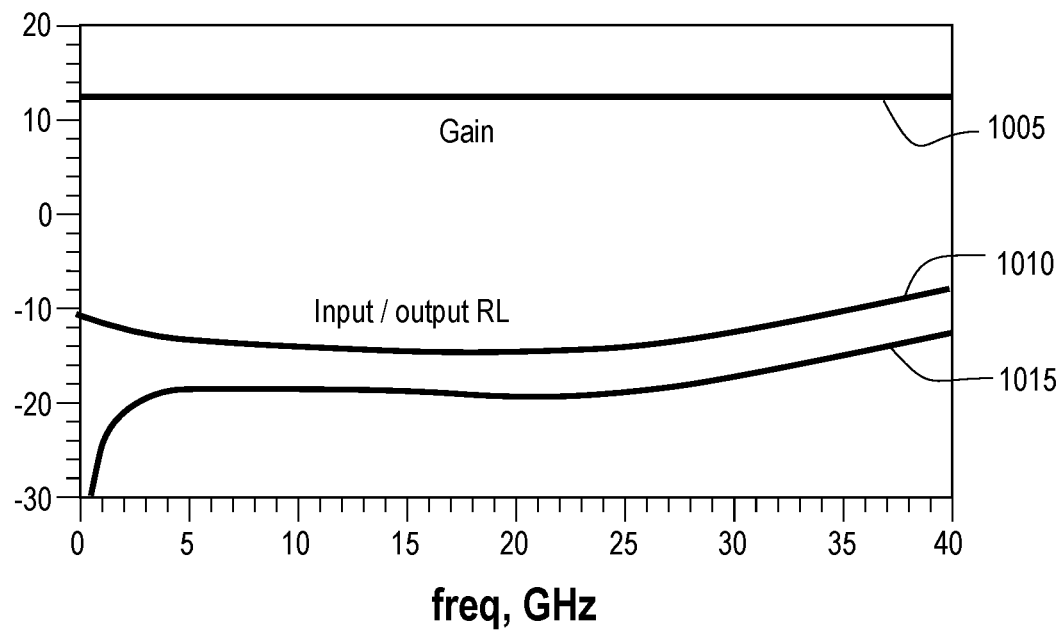
FIG. 10 is a graph showing gain and input/output return loss for the embodiment shown in FIG. 9A over the indicated wide range of frequencies.

Since the output load is proportional to the input impedance looking into the source follower Q3, which is inductive at lower frequencies, the addition of capacitor C3 (in parallel with $C_{gs}$) contributes to device bandwidth at lower frequencies up to a few gigahertz. To extend the low-frequency operation the input and output DC blocking capacitors C1 and C4 should preferably be off-chip components to accommodate a size of capacitance needed for this frequency performance. The other matching networks as well as bypass capacitors may be realized in 45 nm SOI technology FIG. 10 is a graph showing gain 1005 and input return loss 1010 and output return loss 1015 for the embodiment shown in FIG. 9A over the indicated wide range of frequencies extending from less than 1 GHz to 40 GHz.

Figure 11:
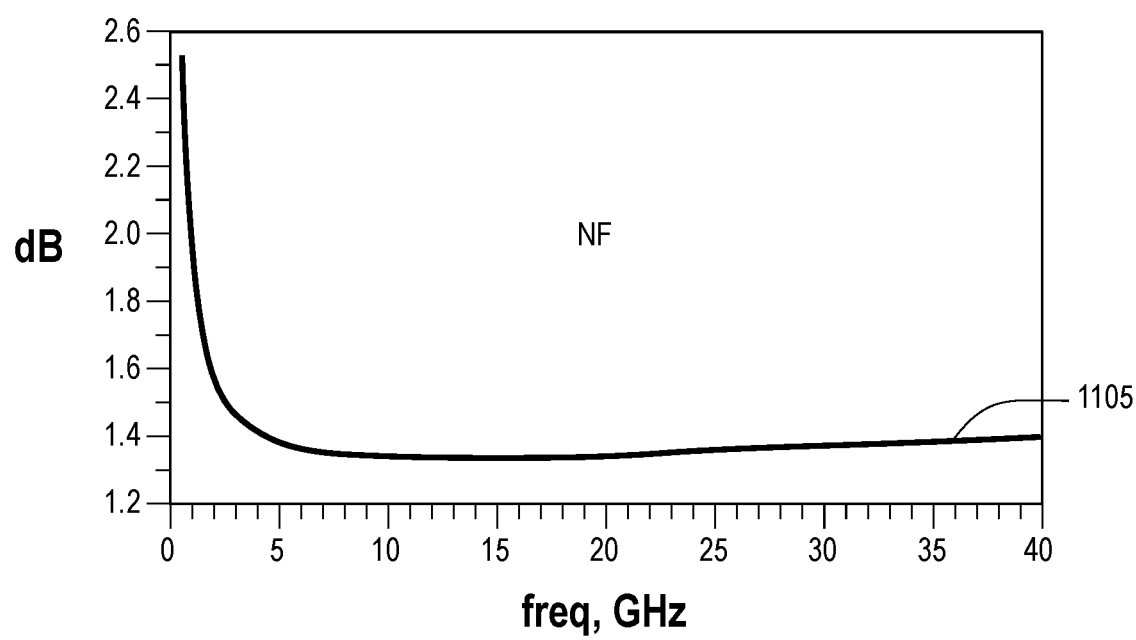
FIG. 11 is a graph showing the noise figure for the embodiment shown in FIG. 9A over the indicated wide range of frequencies.

FIG. 11 is a graph showing the noise figure 1105 for the embodiment shown in FIG. 9A over the indicated wide range of frequencies. Although the noise figure for frequencies below 2 GHz is higher than that achieved for the remainder of the operating range, the circuitry still provides significant gain and is operational even at these lower frequencies.

Figure 12:
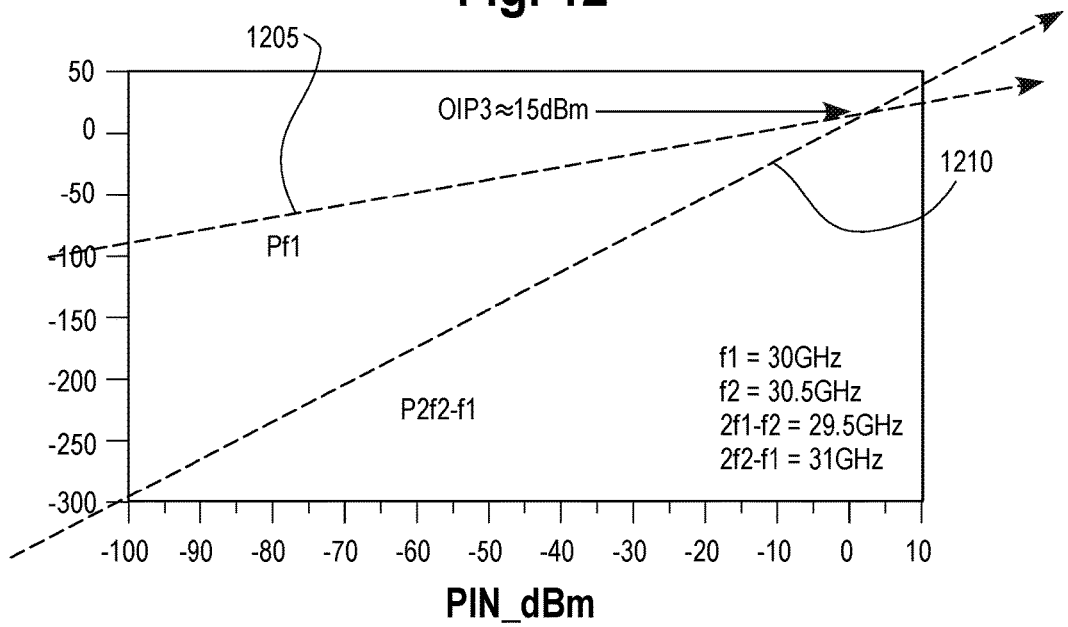
FIG. 12 is a graph showing 3rd order distortion associated with the embodiment shown in FIG. 9A.

FIG. 12 is a graph that displays the results of a simulated two-tone test for third order distortion associated with the embodiment shown in FIG. 9A. Graph is a plot of a typical two-tone test. Two frequency signals f1=30 GHz and f2=30.5 GHz are injected at the input of amplifier. The power of signals f1 and f2 are increased and powers for f1 signal, f2 signal, and distortion products at 2f1-f2 and 2f2-f1 are measured at the output of amplifier. Output Third-order Intermodulation Product (OIP3) is achieved from intersection of extrapolated power line slopes 1205 and 1210. The line slopes for 1205 and 1210 are 1 and 3, respectively. The predicted value of 15 dBm for OIP3 is very good for low power applications at MMW frequencies.

Figure 13:
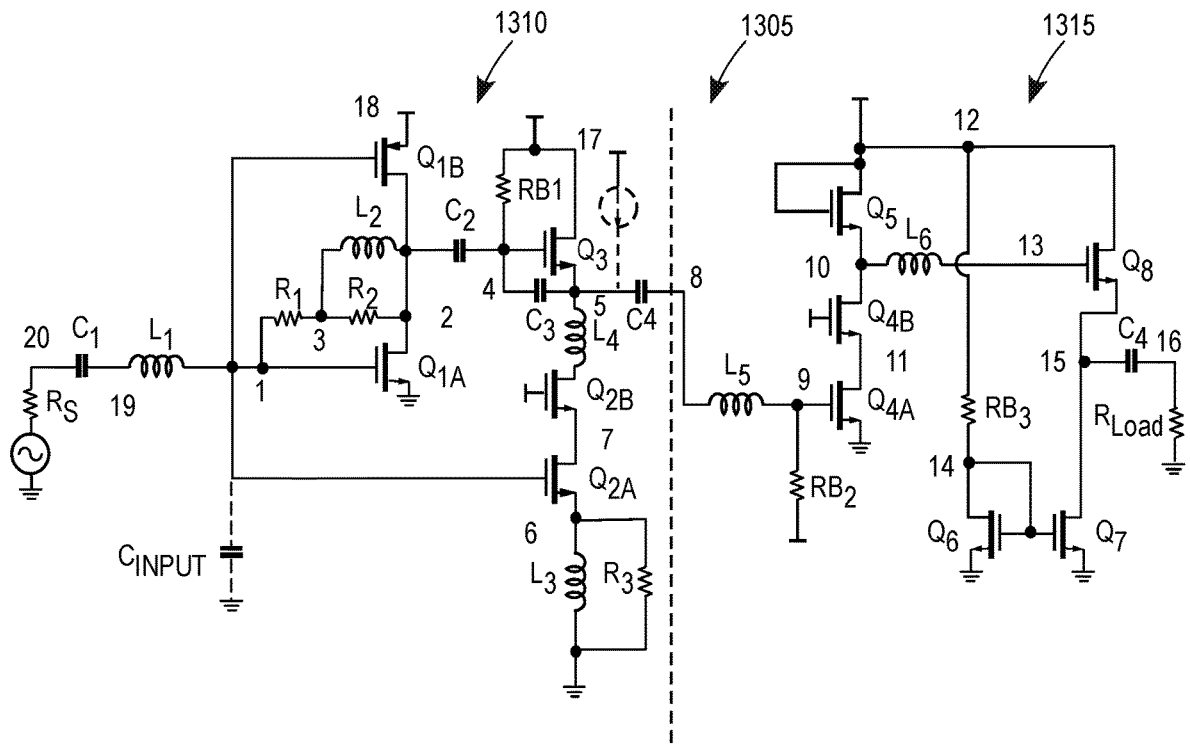
FIG. 13 is a schematic diagram of a low noise amplifier with noise cancellation that includes a further amplification stage suited for providing increased gain over a wide range of frequencies.

FIG. 13 is a schematic diagram of a low noise amplifier 1305 that includes a first stage 1310 with noise cancellation and a further amplification stage 1315 suited for providing additional gain over a wide range of frequencies. Stage 1310 is the same as amplifier 900 and hence requires no additional discussion. Stage 1315 consist of a cascode device (Q4A and Q4B) and a source follower Q84 providing broadband matching to a 50 ohm load. The active load Q5 for the cascode device is utilized to reduce power consumption. Device Q4B improves the frequency stability for device Q4A over a wide frequency range by providing isolation for Q4A. A current mirror consisting of Q6 and Q7 provides for biasing of the output device Q8 as well as part of the load for the emitter follower Q8. The current mirror determines the current supplied to output device Q8 as controlled by bias resistor RB3. Low noise amplifier 1305 is suited for use as a system-on-a-chip application, as an integrated microwave assembly, or as a stand-alone module such as in a communication receiver. The inductors L5 and L6 provide wide band impedance matching for Q4A and Q8, respectively.

Figure 14:
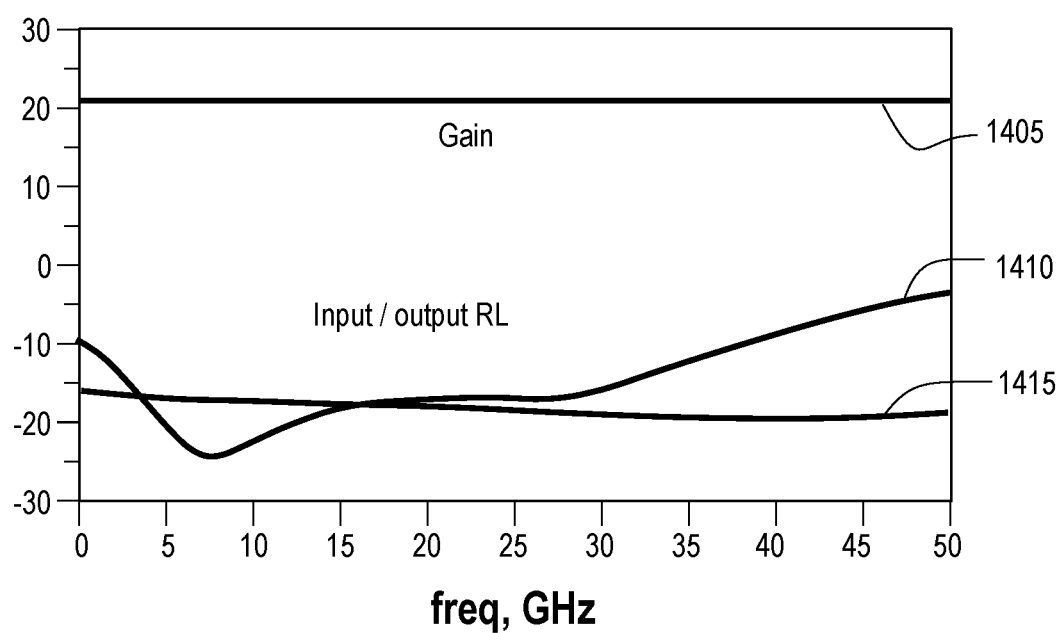
FIG. 14 is a graph showing gain and input/output return loss for the embodiment shown in FIG. 13.

FIG. 14 is a graph showing gain 1405 and input return loss 1410 and the output return loss 1415 for the embodiment shown in FIG. 13. It will be noted that the gain is substantially flat at just over 20 dB from less than 0.5 GHz to 50 GHz. That is, a substantially flat gain does not vary by more than two dB over the frequency range.

Figure 15:
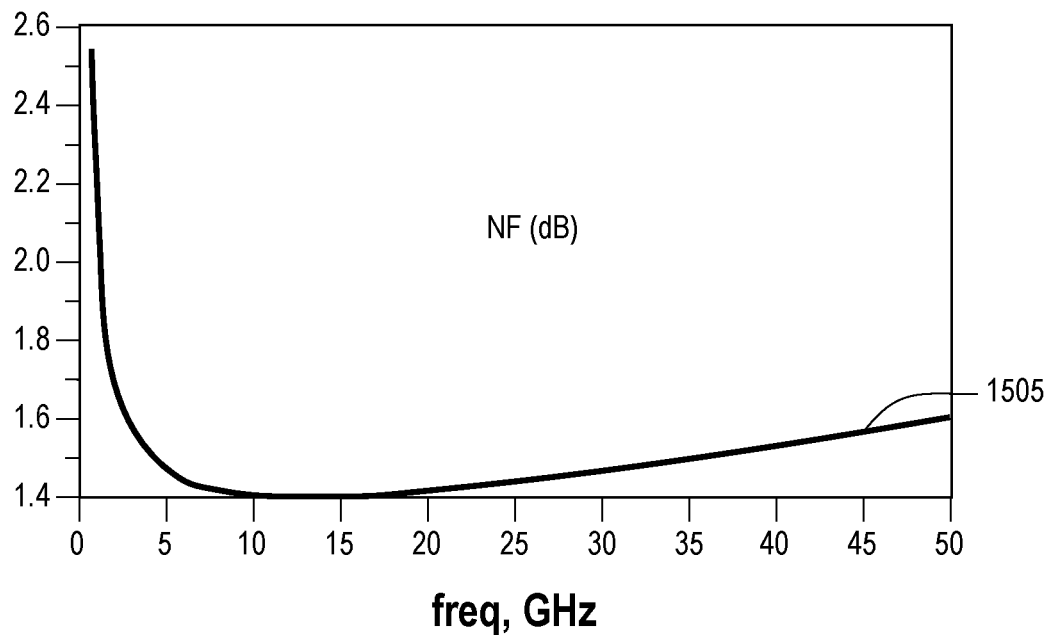
FIG. 15 is a graph showing the noise figure for the embodiment shown in FIG. 13 over the indicated wide range of frequencies.

FIG. 15 is a graph showing the noise FIG. 1505 for the embodiment shown in FIG. 13 over the indicated wide range of frequencies. From 1 GHz to 50 GHz the noise figure is below 2 dB; between 3 GHz and 50 GHz the noise figure remains below 1.6 dB. Although the noise figure is higher below about 3 GHz, it will be noted that the amplifier is still functional and provides the same gain at the lower frequencies as at higher frequencies in the range; thus making it suitable for operation for a number of applications even at these lower frequencies.

Figure 16:
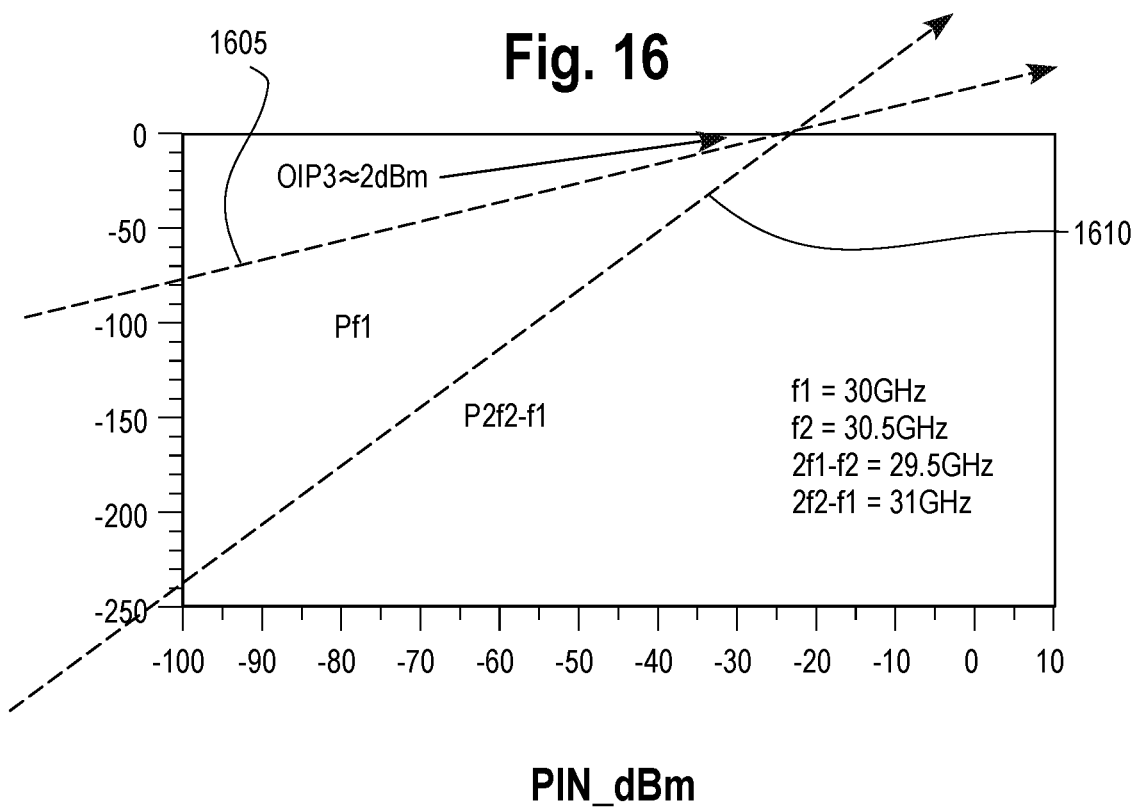
FIG. 16 is a graph showing 3rd order distortion associated with the embodiment shown in FIG. 13.

FIG. 16 is a graph that displays the results of a simulated two-tone test for third order distortion associated with the embodiment shown in FIG. 13. Graph is a plot of a typical two-tone test. Two frequency signals f1=30 GHz and f2=30.5 GHz are injected at the input of the amplifier. The power of signals f1 and f2 are increased and powers for f1 signal, f2 signal, and distortion products at 2f1-f2 and 2f2-f1 are measured at the output of amplifier. Output Third-order Intermodulation Product (OIP3) of about 2 dBm is achieved from intersection of extrapolated power line slopes 1605 and 1610. The line slopes for 1605 and 1610 are 1 and 3, respectively. The predicted value of IIP3 of about −18 dBm is anticipated in view of the high gain. Linearity can be improved by increasing the output stage device size and linearity enhancement techniques.

Although exemplary implementations of the invention have been depicted and described in detail herein, it will be apparent to those skilled in the art that various modifications, additions, substitutions, and the like can be made without departing from the spirit of the invention. For example, although all the components of the illustrative embodiments are envisioned as being incorporated within a CMOS SOI substrate (except as specifically stated), other semiconductor technologies could be used for implementations that address similar or different frequencies of operation.

The scope of the invention is defined in the following claims.

The invention claimed is:

1. A low noise amplifier circuit having CMOS transistors and integral noise cancellation circuitry contained on a silicon on insulator substrate and configured to operate over a frequency range of about 0.5 GHz to 50 GHz, the low noise amplifier circuit comprising:

an amplifier using one or more of the CMOS transistors that amplifies a first signal and a first noise signal coupled to an input of the amplifier and generates corresponding amplified second signal and second noise signal, respectively, at an output of the amplifier, the second amplified signal being substantially 180 degrees out of phase relative to the phase of the first signal, the amplified second noise signal having substantially the same phase as the first noise signal, the first signal having a frequency in the range of 0.5 GHz to 50 GHz;

a feedback circuit connected to the amplifier that controls an amount of amplification of the second signal and second noise signal provided by the amplifier, the feedback circuit having a non-linear gain factor versus frequency with the gain factor increasing the applied gain of the amplifier with increasing frequency in the frequency range, the increasing gain factor compensating for an inherent decrease in gain of the amplifier with increasing frequency due to internal capacitances associated with the amplifier to provide a substantially constant amount of amplification of the second signal and second noise signal over the frequency range;

auxiliary amplifier using one or more CMOS transistors receives the first signal and the first noise signal at an aux input and generates at an aux output third and fourth signals that are amplified versions of the first signal and the first noise signal, respectively, the third and fourth signals each have a phase that is substantially 180 degrees relative to the phase of the first signal and first noise signal, respectively, an amount of amplification provided by the aux amplifier being substantially equal to an amount of amplification provided by the amplifier;

a summation circuit receives the second signal, the second noise signal, the third signal and the fourth signal, and generates at a summation output a resultant signal where the resultant signal includes a constructive addition of the second signal and third signals, and a destructive addition of the second noise signal and the fourth signal, where the destructive addition results in substantial cancellation of the second noise signal and the fourth signal since the latter two signals are substantially equal in amplitude but have 180 degree opposite phases;

the CMOS transistors of the amplifier and the aux amplifier and the summation circuit being disposed on a single silicon on insulator substrate.

2. The low noise amplifier circuit of claim 1 wherein the resultant signal has an associated noise figure of less than 2 decibels from 20 GHz to 50 GHz and less than 1.6 dB from 3 GHz to 50 GHz.

3. The low noise amplifier circuit of claim 1 further comprising:
the feedback circuit connected between a drain and gate of the amplifier;
the aux amplifier having an unloaded amount of gain that is substantially the same as the gain provided by the amplifier for the second noise signal.

4. The low noise amplifier circuit of claim 1 wherein:
the amplifier includes at least two CMOS transistors configured in cascode operation with respective drains connected together as the output of the amplifier;
the summation circuit includes at least one CMOS transistor;
the aux amplifier includes at least two CMOS transistors connected in cascode with each other and with the at least one CMOS transistor of the summation device;

a cascode current source with high output impedance is connected to inject current into one of the cascode connected transistors of the aux amplifier and configured so that the injected current flows through the at least two CMOS transistors connected in cascode but does not flow through the at least one CMOS transistor of the summation circuit.

5. The low noise amplifier circuit of claim 1 further comprising a frequency matching network, connected to the input of the amplifier, including at least one capacitor and one inductor configured to enhance impedance stability throughout the frequency range.

6. The low noise amplifier circuit of claim 1 further comprising:
a high pass filter connected to the summation circuit that high pass filters the second signal and second noise signal prior to said signals being received by the summation device.

7. The low noise amplifier circuit of claim 1 further comprising:
at least one inductor, connected in series with the one or more transistors of the auxiliary amplifier, configured to provide inductive degeneration that stabilizes impedance over the frequency range by compensating for internal capacitance associated with the one or more transistors of the auxiliary amplifier.

8. The low noise amplifier circuit of claim 1 wherein the feedback circuit comprises at least one inductor in series with at least a first resistor.

9. The low noise amplifier circuit of claim 8 wherein the feedback circuit comprises a second resistor in parallel with the at least one inductor.

10. The low noise amplifier circuit of claim 9 wherein the second resistor and the at least one inductor are each coupled to an output of the amplifier and one terminal of the first resistor is coupled to the input of the amplifier.

11. The low noise amplifier circuit of claim 1 further comprising a secondary amplification stage coupled to the summation output, the secondary amplification stage providing additional amplification at a final output.

12. The low noise amplifier circuit of claim 11 wherein the amplifier, feedback circuit, auxiliary amplifier, summation circuit, and the secondary amplification stage are all formed as part of a single integrated silicon on insulator substrate utilizing 45 nm CMOS technology.

13. The low noise amplifier circuit of claim 11 wherein the secondary amplification stage comprises a cascode circuit having an input that receives the resultant signal from the summation output, the cascode circuit having a first CMOS device having a common source configuration coupled to a second CMOS device having a common gate configuration, the input of the cascode circuit coupled to a gate of the first CMOS device and an output from the cascode circuit being at a drain of the second CMOS device.

14. The low noise amplifier circuit of claim 13 further comprising a third CMOS device configured as a source follower, a gate of the third CMOS device coupled to the output from the cascode circuit, a source of the third CMOS device coupling a further amplified resultant signal to a load.

15. The low noise amplifier circuit of claim 14 further comprising two CMOS devices coupled together in a current mirror configuration with one of said two CMOS devices coupled to the source of the third CMOS device to establish a bias for the third CMOS device.

* * * * *